United States Patent [19]

Mizuno

[11] Patent Number: 4,529,835
[45] Date of Patent: Jul. 16, 1985

[54] CERAMIC THICK FILM CIRCUIT SUBSTRATE

[75] Inventor: Fukuzo Mizuno, Fujiyoshida, Japan

[73] Assignee: NGK Insulators, Ltd., Japan

[21] Appl. No.: 544,243

[22] Filed: Oct. 21, 1983

[30] Foreign Application Priority Data

Oct. 23, 1982 [JP] Japan ................. 57-187675

[51] Int. Cl.$^3$ .............................. H05K 1/09
[52] U.S. Cl. .................... 174/68.5; 361/305; 361/411; 420/432; 420/463
[58] Field of Search ........... 361/402, 411, 305; 420/432, 463, 466; 174/68.5

[56] References Cited

U.S. PATENT DOCUMENTS

| | | | |
|---|---|---|---|
| 1,096,655 | 5/1914 | Weintraub | 420/432 |
| 1,779,603 | 10/1930 | Kingsbury | 420/463 |
| 2,094,570 | 9/1937 | Estes et al. | 420/432 X |
| 3,511,640 | 5/1970 | Kelemen | 361/305 X |
| 3,838,204 | 9/1974 | Ahn et al. | 361/411 X |
| 3,872,360 | 3/1975 | Sheard | 361/305 |
| 3,912,611 | 10/1975 | Royer et al. | 174/68.5 X |
| 4,155,660 | 5/1979 | Takahasi et al. | 420/432 X |
| 4,434,544 | 3/1984 | Dohya et al. | 174/68.5 X |

FOREIGN PATENT DOCUMENTS 157988  1/1921  United Kingdom ............... 420/466

Primary Examiner—R. R. Kucia
Attorney, Agent, or Firm—Parkhurst & Oliff

[57] ABSTRACT

Disclosed herein is a ceramic thick film circuit substrate for use in an electronic circuit part, characterized in that a conductive layer at a place where it is to be connected with a thick film circuit is composed of a mixture of tungsten and at least one of platinum and palladium. Based on 100 parts by weight of tungsten, platinum is 0.1–100 parts by weight in the case of platinum alone, palladium is 0.1–20 parts by weight in the case of palladium alone; and a total amount of platinum and palladium is 0.1–76 parts by weight in the case of combination of platinum and palladium. Thereby, the ceramic thick film circuit substrate has an excellent oxidation resistance, and low contact resistance to the thick film circuit.

1 Claim, 2 Drawing Figures

CERAMIC THICK FILM CIRCUIT SUBSTRATE

BACKGROUND OF THE INVENTION

(1) Field of the Invention

The present invention relates to a ceramic thick film circuit substrate useful for an electronic components, and more particularly to a hybrid integrated circuit.

(2) Description of the Prior Art

As shown in FIG. 1 as the conventional hybrid integrated circuit substrates there has been known a ceramic thick-film circuit substrate 7 in which a ceramic multilayer substrate 5 is constituted by alternately forming a conductive layer 2 consisting of a metal having a high melting point, such as tungsten, molybdenum or the like and a dielectric layer 3 with via-holes and a thick-film circuit 6 consisting of a conductor, resistor and the like which connect to the conductive layer 2, is formed thereon.

In such a ceramic thick film circuit substrate 7, silver paste has been employed as a material for forming the thick film circuit for the reason of electrical characteristics such as conductivity and specific resistance, the adhesion to the ceramic multilayer substrate and the like, and the thick film circuit is formed by firing at a temperature of more than 600° C. in an oxidizing atmosphere. Therefore, such a circuit substrate has the drawbacks that the conductive of the metal having high melting point where it is coated with no dielectric layer is likely to undergo oxidation, so that the resistance between the conductive layer and the thick film circuit will increase.

To eliminate these problems, it has been proposed to apply gold-plating on the conductive layer of the ceramic multilayer substrate, but it has been difficult to assuredly obtain a ceramic thick film circuit substrate which can completely prevent the oxidation of the metal having the high melting point and this has further problems in economy.

The present invention has been contrived to solve the above-mentioned problems of the prior art.

SUMMARY OF THE INVENTION

An object of the invention is therefore to provide a ceramic thick film circuit substrate having high oxidation resistance and high conductivity.

Another object of the invention is to manufacture a ceramic thick film circuit substrate economically which necessitates neither any particular plating treatment nor application of any special material for forming a thick film.

According to the invention, in a ceramic thick film circuit substrate in which a thick film conductor which is to be fired in an oxidizing atmosphere, is provided on a ceramic multilayer substrate, a conductive layer of the ceramic multilayer substrate at a place where the thick film conductor is connected, is composed of a mixture of tungsten with at least one of platinum and palladium in which on the basis of 100 parts by weight of tungsten, platinum is 0.1–100 parts by weight in the case of platinum alone; palladium is 0.1–20 parts by weight in the case of palladium alone and in the case of combination of platinum and palladium, the total amount is 0.1–76 parts by weight but palladium is not greater than 20 parts by weight.

These and other objects, features and advantages of the invention will be better appreciated upon reading of the following description of the invention in conjunction with the attached drawing with understanding that some modifications, variations and changes may be made by the skilled in the art to which the invention pertains without departing from the spirit of the invention and the scope of the claims attached hereto.

DETAILED DESCRIPTION OF THE PREFERRED EMBODIMENT

Now, the invention will be explained more in detail with reference to the specific example shown in FIG. 2 as a preferred embodiment according to the invention which is merely illustrative of the invention but never interpreted to limit the scope of the invention.

As alreadly known, a ceramic multilayer substrate is constituted in such a manner that a metallizing paste composed mainly of a metal having a high melting point, such as tungsten, molybdenum or the like is printed onto a ceramic green sheet of almina, beryllia or the like to form a conductive layer, an insulating paste is printed onto the said layer and the ceramic green sheet so as to form predetermined via holes to form a dielectric layer, the conductive layer and the dielectric layer are alternately printed to form a multilayer green sheet and then the resulting multilayer green sheet is fired. According to the invention, in the ceramic thick film circuit substrate wherein the thick film circuit is formed of a thick film paste, which is provided on the ceramic multilayer substrate and is fired under an oxidizing atmosphere, the composition of the conductive layer of the ceramic multilayer substrate to be electrically connected to the thick film circuit are specifically defined.

The composition of the conductive layer is defined based on the following reason. When platinum or palladium is less than 0.1 part by weight based on 100 parts by weight of tungsten, the conductive layer is oxidized during firing of the thick film paste and is higher in the electrical resistance and can not be practically used. When platinum and palladium are respectively contained alone and exceeds 100 parts by weight and 20 parts by weight respectively, the adhesion strength of the conductive layer to the ceramic substrate and the dielectric layer becomes poor and the conductive layer is apt to disengage.

The reason why in the case of platinum and palladium employed in combination, the total amount is limited to not more than 76 parts by weight is that too much addition becomes to the deterioration in the adhesion of the conductive layer and increase of electrical resistance of the conductive layer.

Figure 1:
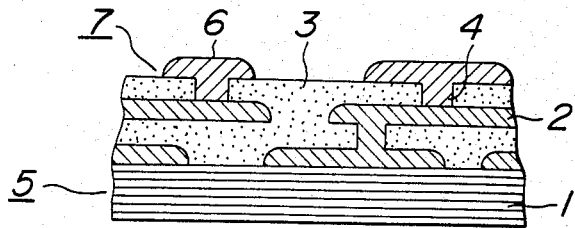
FIG. 1 is a sectional view of a circuit substrate of the prior art.
Figure 2:
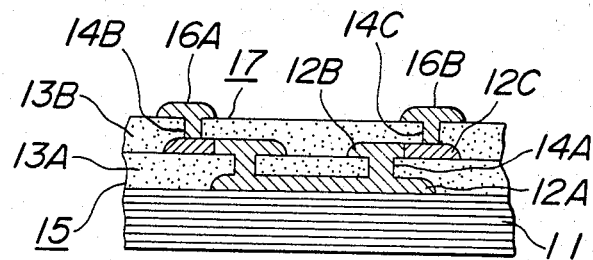
FIG. 2 is a sectional view illustrating an embodiment of a circuit substrate according to the present invention.

As shown in FIG. 2, according to the invention, a tungsten-based metallizing paste obtained by adding a printing aid such as an organic binder to tungsten powder is screen-printed onto an alumina-based ceramic green sheet 11 to form a conductive layer 12A; then an insulating paste having the same composition as the alumina-based ceramic green sheet is screen-printed thereon so as to form via holes at predetermined positions to form a dielectric layer 13A; and a conductive layer 12B having the same composition as the conductive layer 12A is formed onto the dielectric layer 13A and in the via holes 14A, while a metallizing paste prepared by mixing tungsten, platinum and palladium as shown in Table 1 together with a printing aid, is screen printed to form a conductive layer 12C which communicates with the conductive layer 12B.

Thereafter, the same insulating paste as the dielectric layer 13A, is screen-printed on the conductive layers 12B, 12C and the dielectric layer 13A so as to form via holes 14B and 14C on a part of the above described conductive layer 12C to form a dielectric layer 13B, and then firing is carried out at 1,550° C. in a reducing atmosphere for 2 hours to obtain a ceramic multilayer substrate 15.

With respect to the ceramic multilayer substrate thus obtained, the adhesion was evaluated based on the outer appearance by sticking the conductive layer 12C with a needle and further the electric resistance between the via holes 14B and 14C was measured by needle contact method.

Next, electrodes 16A and 16B are formed on the specific portions of the dielectric layer 13B and in the via holes 14B, 14C provided onto the conductive layer 12C of the ceramic multilayer substrate through screen-printing with a silver thick film paste (Product No. D-4021 of Shoei Chemical, Inc. of Japan), and then firing is carried out at 620° C. in air for 10 minutes to obtain a ceramic thick film circuit substrate 17.

The ceramic thick circuit substrates thus obtained, which are provided with conductive layer of a variety of metal compositions, were measured with respect to the resistance between the electrodes 16A and 16B. The appearance and the value obtained by subtracting the resistance value between the via holes from that between the electrodes in the thick film, i.e., the contact resistance value between the thick film and the conductive layer are shown in Table 1 respectively.

TABLE 1

| No. | | Compositions of conductive layer (parts by weight) | | | Appearance Evaluation *1 | Contact resistance | |
|---|---|---|---|---|---|---|---|
| | | W | Pt | Pd | | (Ω) | Evaluation *2 |
| 1 | Present | 100 | 0.1 | 0 | o | 0.13 | o |
| 2 | inven- | 100 | 0.5 | 0 | o | 0.01 | o |
| 3 | tion | 100 | 2.5 | 0 | o | 0.01 | o |
| 4 | | 100 | 10 | 0 | o | 0.01 | o |
| 5 | | 100 | 20 | 0 | o | 0.01 | o |
| 6 | | 100 | 30 | 0 | o | 0.01 | o |
| 7 | | 100 | 50 | 0 | o | 0.01 | o |
| 8 | | 100 | 100 | 0 | o | 0.01 | o |
| 9 | | 100 | 0 | 0.1 | o | 0.08 | o |
| 10 | | 100 | 0 | 0.5 | o | 0.01 | o |
| 11 | | 100 | 0 | 2.5 | o | 0.01 | o |
| 12 | | 100 | 0 | 10 | o | 0.01 | o |
| 13 | | 100 | 0 | 20 | o | 0.01 | o |
| 14 | | 100 | 0.05 | 0.05 | o | 0.09 | o |
| 15 | | 100 | 0.25 | 0.25 | o | 0.01 | o |
| 16 | | 100 | 10 | 10 | o | 0.01 | o |
| 17 | | 100 | 40 | 20 | o | 0.01 | o |
| 18 | | 100 | 56 | 20 | o | 0.01 | o |
| 19 | Com- | 100 | 0 | 0 | o | 0.47 | x |
| 20 | para- | 100 | 150 | 0 | x | — | — |
| 21 | tive | 100 | 0 | 30 | x | — | — |
| 22 | Example | 100 | 60 | 20 | x | — | — |

*1 o . . . good x . . . poor in adhesion of conductive layer.
*2 o . . . 0.2Ω or less x . . . 0.2Ω or more It has been confirmed from the above results that the ceramic thick film circuit substrates having the conductive layers according to the invention are excellent in the adhesion of the conductive layer and low in the contact-resistance.

As also obvious from the above, the ceramic thick film circuit substrates having the conductive layers according to the invention have the satisfactory oxidation resistance against the oxidizing atomsphere to be employed for the formation of the thick film circuit, and low in the contact resistance to the thick film circuit. Further, since it is not necessary to specifically select the plating material and the thick film forming material and it is possible to emply a screen-printing process which has been conventionally used for the formation of the ceramic multilayer substrates, economical and reliable ceramic thick film circuit substrates can be obtained and therefore the present invention is extremely advantageous in industry.

What is claimed is:

1. In a ceramic thick film circuit substrate in which a thick film conductor which is to be fired in an oxidizing atmosphere, is provided on a ceramic multilayer substrate, the improvement comprises that a conductive layer of the ceramic thick film circuit substrate to which the thick film conductor is connected, is composed of tungsten, and at least one of platinum and palladium, and that platinum is 0.1–100 parts by weight in the case of platinum alone, palladium is 0.1–20 parts by weight in the case of palladium alone, and a total amount of platinum and palladium is 0.1–76 parts by weight in the case of combination of these elements provided that palladium is 20 parts by weight or less, the part by weight of platinum and palladium being based on 100 parts by weight of tungsten.

* * * * *